US006596597B2

(12) United States Patent
Furukawa et al.

(10) Patent No.: US 6,596,597 B2
(45) Date of Patent: Jul. 22, 2003

(54) METHOD OF MANUFACTURING DUAL GATE LOGIC DEVICES

(75) Inventors: Toshiharu Furukawa, Essex Junction, VT (US); Mark C. Hakey, Fairfax, VT (US); Steven J. Holmes, Milton, VT (US); David V. Horak, Essex Junction, VT (US); William H. Ma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 212 days.

(21) Appl. No.: 09/879,590

(22) Filed: Jun. 12, 2001

(65) Prior Publication Data

US 2002/0187610 A1 Dec. 12, 2002

(51) Int. Cl.$^7$ .............................................. H01L 21/336
(52) U.S. Cl. ...................... 438/299; 438/283; 438/303; 438/176; 438/151; 438/163
(58) Field of Search ................................ 438/299, 283, 438/199, 151, 163, 285, 589, 270, 259, 303, 305, 176, 173, 178

(56) References Cited

U.S. PATENT DOCUMENTS

| | | | | |
|---|---|---|---|---|
| 5,414,288 A | * | 5/1995 | Fitch et al. ................. | 257/328 |
| 5,612,552 A | * | 3/1997 | Owens ........................ | 257/202 |
| 5,801,089 A | * | 9/1998 | Kenney ....................... | 438/589 |
| 5,981,345 A | * | 11/1999 | Ryum et al. ................. | 438/303 |
| 6,429,484 B1 | * | 8/2002 | Yu .............................. | 257/347 |
| 2001/0028067 A1 | * | 10/2001 | Awano ........................ | 257/192 |

OTHER PUBLICATIONS

Jong–Ho Lee, et al., IEEE IEDM 99–71 through IEDM99–74.
Hon–Sum Philip Wong, et al., IEEE IEDM 98–407 through IEDM 98–410.
Hon–Sum Philip Wong, et al., IEEE IEDM 97–427 through IEDM 97–429.

* cited by examiner

*Primary Examiner*—Matthew Smith
*Assistant Examiner*—Igwe U. Anya
(74) *Attorney, Agent, or Firm*—Salzman & Levy; Lawrence R. Fraley

(57) ABSTRACT

The present invention features double- or dual-gate logic devices that contain gate conductors that are consistently self-aligned and that have channels that are of constant width. The inventive process also provides a method of selectively etching germanium-containing gate conductor materials without significantly etching the adjacent silicon channel material. In this manner, the gate conductor can be encased in a dielectric shell without changing the length of the silicon channel. A single-crystal silicon wafer is utilized as the channel material. Pillars or stacks of self aligned dual gate MOSFETs are generated by etching, via the juxtaposition of overlapping germanium-containing gate conductor regions. Vertically etching through regions of both gate conducting material and dielectric insulating material provides an essentially perfect, self-aligned dual gate stack. A process is described wherein the gate conductor material can be selectively etched without etching the channel material.

23 Claims, 14 Drawing Sheets

METHOD OF MANUFACTURING DUAL GATE LOGIC DEVICES

FIELD OF THE INVENTION

This invention generally relates to semiconductor devices formed on a bulk single-crystal semiconductor substrate and, more particularly, to dual gate logic semiconductor devices composed of germanium-containing gate conductors and manufactured by a self-aligning process.

BACKGROUND OF THE INVENTION

For complimentary metal on silicon integrated circuits (CMOS ICs) the main performance factors are speed, power dissipation, and device packing density. Therefore, over the past several decades, integrated chip manufacturers have had as one major goal the reduction in microelectronic device size. Both manufacturer and consumer benefit from this reduction in size either by reduced cost or greater performance characteristics. However, the mere reduction in size of the components in the IC will lead to undesirable IC performance problems. In particular, power dissipation due to increased device leakage currents may increase or circuit speed may be degraded. Reliability problems that can afflict metal on silicon field effect transistors (MOSFETs) might also be worsened, including hot-carrier degradation, gate-oxide wearout and electromigration. Clearly, if the degree of process control is not increased, variations in these parameters will become larger (on a percentage basis) as the devices become even smaller. Therefore, it is necessary for the manufacturer of such devices to utilize novel designs and employ processes having tighter processing controls that will mitigate performance and reliability problems, while still providing higher packing densities.

One particular difficulty in the manufacturing processes of some planar double-gate MOSFET devices is that the top and bottom gate conductors may not be self-aligned to each other, and the gate conductors may be of varying widths. Device yield and performance can be significantly constrained by such misalignment of the gate-conductors, and by large deviations in relative channel length. For example, it is reported that misalignment will cause extra gate to source/drain overlap capacitance as well as loss of current drive. Additional information on the effect of misalignment is described by Tanaka of Fujitsu in the 1994 VLSI Symposium.

Another difficulty in the manufacturing processes of these planar double-gate MOSFET devices is that the channel thickness is not of uniform thickness and/or uniform purity. For example, double-gate MOSFET devices should have a uniform and thin (10 to 25 nm) silicon channel. Typically, previous manufacturing processes formed this channel using epitaxially grown silicon via such processes as chemical vapor deposition or sputtering. These processes however, do not necessarily provide sufficient uniformity in thickness or purity, the latter due to entrapment of impurities. As will be described in detail hereinbelow the present invention utilizes a single crystal silicon wafer that is ground and polished to high precision to provide a silicon channel having physical and electrical properties that are superior to the prior art epitaxially grown silicon channels. References to prior art dual-gate MOSFET manufacturing processes can be found in Jong-Ho Lee, et al. IEEE IEDM99-71 through IEDM99-74; Hon-Sum Philip Wong, et al., IEEE IEDM98-407 through IEDM98-410; and Hon-Sum Philip Wong, et al., IEEE IEDM97-427 through IEDM97-429.

Over the years the preeminent semiconductor material for use in integrated chip technology has been silicon. For example, S. Wolf and R. N. Tauber in SILICON PROCESSING (copyright 1986) Volume 1 page 1 state "Germanium was the original semiconductor material used to fabricate diodes and transistors. The narrow bandgap of Ge (0.66 eV), however, causes reverse-biased p-n junctions in Ge to exhibit relatively large leakage currents. This limits the operation to temperatures below about 100° C. In addition, integrated circuit planar processing requires the capability of fabricating a passivation layer on the semiconductor surface. Germanium oxide could act as such a passivation layer but it is difficult to form, is water soluble, and dissociates at 800 C. These limitations make Ge an inferior material for the fabrication of integrated circuits, compared to silicon".

The use of germanium and germanium alloys has been reported in prior references as gate conducting materials, for example see GERMANIUM ETCHING IN HIGH DENSITY PLASMAS FOR 0.18 MICRON COMPLENTARY METAL-OXIDE-SEMICONDUCTOR GATE PATTERNING APPLICATIONS, C. Monget, A. Schiltz, O. Joubert, L. Vallier, M. Guillermet, B. Tormen, J. Vac. Sci. Technol. B, Vol 16, 1998, p1833–1840. However, none of these references describe, teach, or contemplate the instant inventive feature of selectively etching-back these germanium containing gate conducting materials vis-à-vis the silicon channel.

SUMMARY OF THE INVENTION

The present invention provides for novel manufacturing processes and double- or dual-gate logic devices therefrom that contain gate conductors that are consistently self-aligned and that have channels that are of constant width. These characteristics are important to the industry because device yield and performance can be significantly constrained by such misalignment of the gate conductors, and by large deviations in relative channel length. The inventive process also provides a method of selectively etching germanium-containing gate conductor materials without significantly etching the adjacent silicon channel material. In this manner, the gate conductor can be encased in a dielectric shell without changing the length of the silicon channel. As mentioned supra, changes to the dimensions of the channel can cause adverse performance characteristics.

Also, many prior art planar dual-gate structures rely on the formation of lateral epi-silicon layers for the fabrication of the channel area. Defects in this epi layer can significantly reduce device yield and performance. The present invention alleviates this problem by preferentially utilizing a single-crystal silicon wafer as the channel material.

Therefore, in one aspect of the present invention, a process is described for formation of a uniformly thin channel comprising single-crystal silicon.

In another aspect of the present invention, a process involves etching to generate pillars or stacks of self aligned dual gate MOSFETs via the juxtaposition of overlapping germanium-containing gate conductor regions and vertically etching through regions comprising both gate conducting material and dielectric insulating material. The edge formed by vertically etching through both germanium-containing gate conductor regions provides for essentially a perfect self-aligned dual gate stack.

In yet another aspect of the invention, a process is described wherein the gate conductor material can be selectively etched without etching the channel material.

BRIEF DESCRIPTION OF THE DRAWINGS

For practical reasons, only a portion of a layout for an array of the features on the semiconductor device of this invention is depicted. It is understood that the same element will be identified with like numerical references consistently maintained from FIG. 1 to FIG. 2.

Key to Reference Numbers 10 first single-crystal silicon wafer
11 channel region or stratum formed by thinning first single-crystal silicon wafer 10
12 raised islands comprising silicon residing on an upper surface of a silicon substrate or wafer 10
13 single-crystal channel region or stratum separating gate dielectric regions 24 and 24a
14 sidewalls of a silicon channel region 13
15 topmost surface of the first single-crystal silicon wafer 10
16 etched intermediate topmost surface of the first single-crystal silicon wafer 10
17 topmost surface of the intermediate conformal dielectric coating 110
18 bottommost surface of the first single-crystal silicon wafer 10
19 silicon oxide coating on a silicon channel sidewall 14
20 first gate dielectric layer
20a second gate dielectric layer
22 preliminary first gate dielectric regions or stratum
22a preliminary second gate dielectric regions or stratum
24 intermediary first gate dielectric regions or stratum
24a intermediary second gate dielectric regions or stratum
30 first gate conductor layer
30a second gate conductor layer
32 preliminary first gate conductor regions or stratum
32a preliminary second gate conductor regions or stratum
34 intermediary first gate conductor regions or stratum
34a intermediary second gate conductor regions or stratum
35 intermediary first exterior wall of the gate conductor region 34
35a intermediary second exterior wall of the gate conductor region 34a
36 recessed exterior wall of first gate conductor region
36a recessed exterior wall of second gate conductor region
37 germanium oxide coatings on the first germanium gate conductor regions sidewall 36
37a germanium oxide coatings on the first germanium gate conductor regions sidewall 36a
38 preliminary gate stack comprising gate dielectric 22 and gate conductor 32
39 the topmost surface of preliminary gate stack 38 and dielectric fill regions 52 (same as 17 above)
39a the topmost surface of gate stack 200 and dielectric fill regions 52a after CMP treatment
40 first photoresist layer
40a second photoresist layer
42 first photoresist undeveloped regions
42a second photoresist undeveloped regions
44 first photoresist developed regions
44a second photoresist developed regions
46a etched areas (voids) below second photoresist developed regions 44a
50 first dielectric insulator fill
50a second dielectric insulator fill
52 preliminary first dielectric fill regions
52a preliminary second dielectric fill regions
54 final first dielectric fill regions
54a final second dielectric fill regions
60 second single-crystal silicon wafer
65 topmost surface of final gate stack 200 and dielectric stack 250
70 trimming mask comprising opaque regions 72a and 72b and transparent regions 74
72a opaque mask regions for forming dual gate regions
72b opaque mask regions for forming dielectric insulating regions
74 transparent mask regions for etching through underlayers
80 dielectric coating on exterior recessed walls of first/second gate conductor regions (36 and 36a respectively)
90 polysilicon fill regions
100 silicon dioxide insulator layer
102 intermediary silicon dioxide insulator regions
103 bottom surface of 102 silicon dioxide insulator regions
104 final silicon dioxide insulator regions
105 the upper surface of the silicon dioxide insulator layer 100
110 conformal dielectric coating of a first gate conductor region 32 and first thinned single-crystal silicon substrate 10
120 second dielectric insulator layer
122 intermediary second dielectric insulator regions
124 final second dielectric insulator regions
200 final gate stack or pillar comprising channel region 13, first and second gate dielectric regions 24 and 24a, and gate conductor regions 34 and 34a
210 sidewall of gate stack 200 comprising gate conducting sidewalls 35 and 35a and channel sidewall 37
250 a composite stack or pillar comprising first and second dielectric fill regions 54 and 54a
260 sidewall of composite first and second dielectric fill pillar 250
270 a final dual gate pillar comprising the recessed gate conductors 34 and 34a covered by an insulating layer 80
300 void areas between pillars 200 and 250
350 filled contact holes
380 landing pads
400 source/drain regions.

DETAILED DESCRIPTION OF THE INVENTION

Figures 1A, 1B:
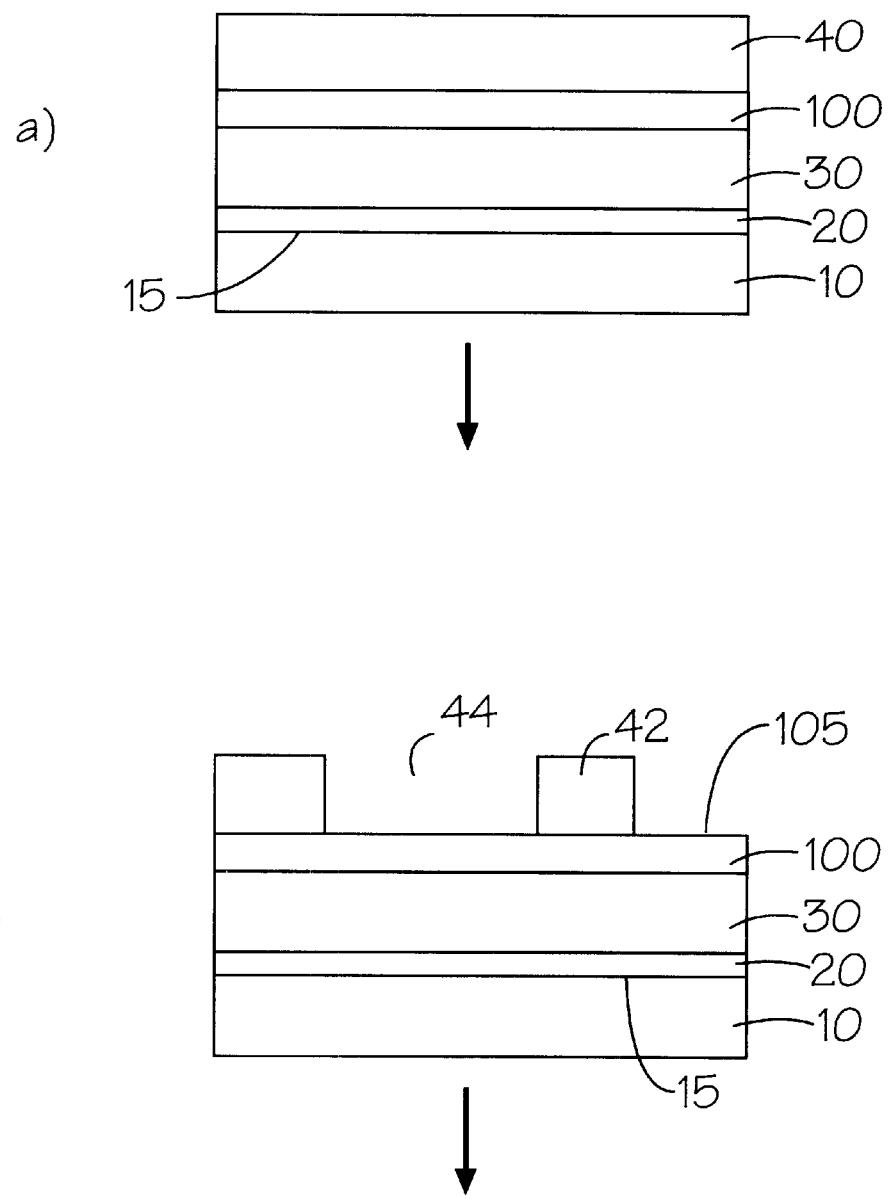
FIG. 1 is an enlarged cross-sectional representation of a portion of one embodiment of a dual gate logic device depicting an area containing to final gate pillars 200 separated by a dielectric fill insulator stack 250 as the device is processed through the steps of one embodiment of the present invention.
Figure 1C:
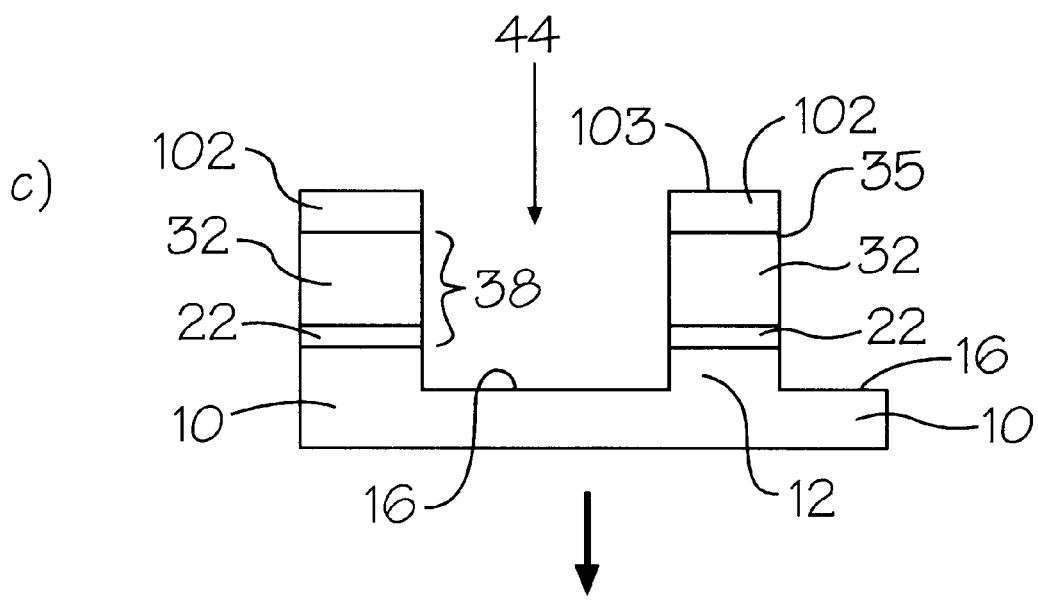
Figure 1D:
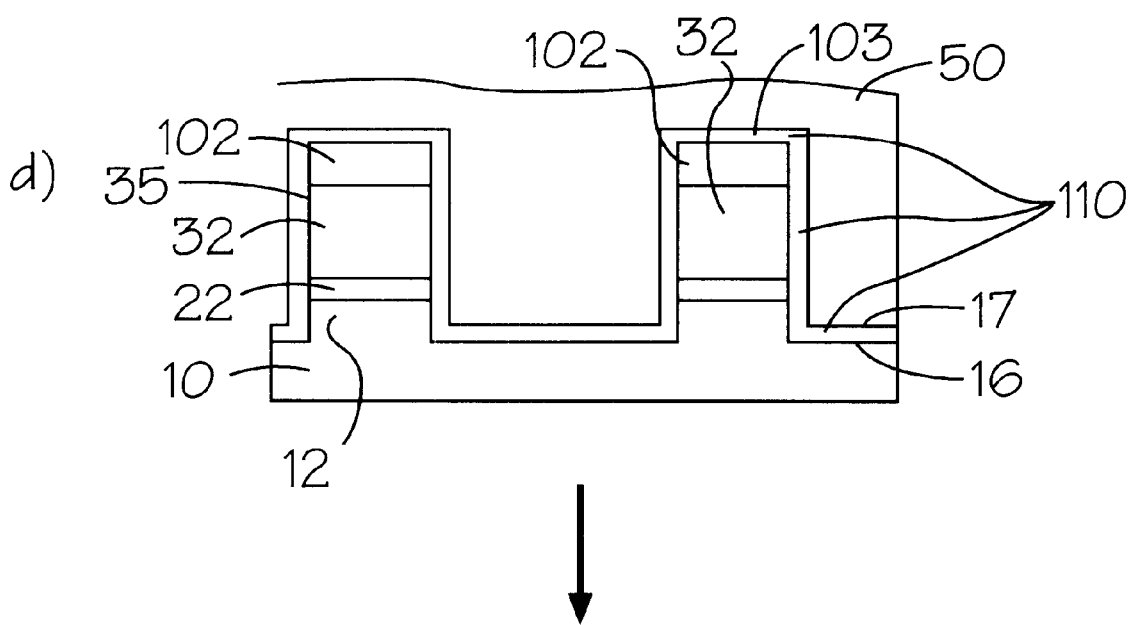
Figure 1E:
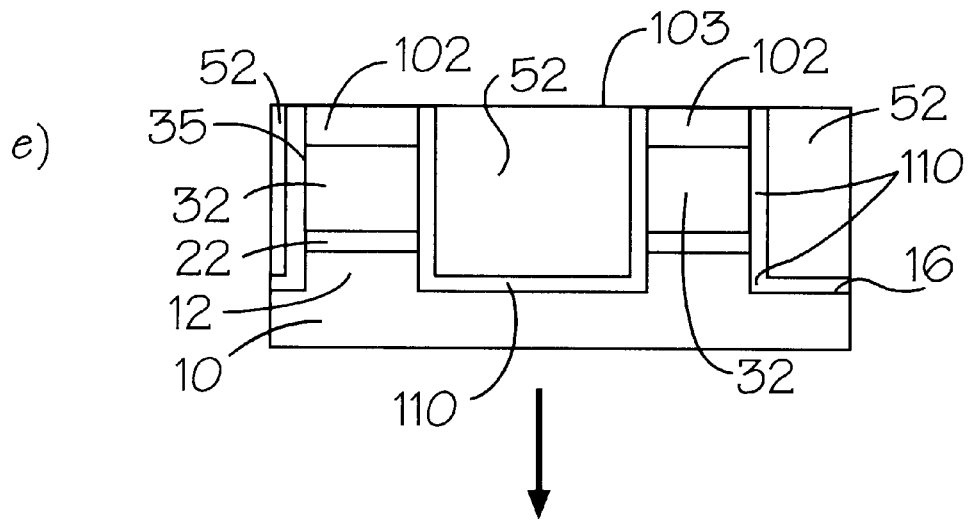

In order to fully understand the present invention each of the aspects of the processes, manufacturing intermediates, and products will be presented in detail with specific reference to the accompanying FIGURES.

Compositional Element of an Embodiment of the Present Invention

Substrate 10

The present invention uses standard substrates as typically used in the art of semiconductor manufacture. The most commonly used material to manufacture the substrate is single-crystal silicon wafer, wherein the silicon is optionally lightly doped. The conversion and purification of polysilicon to single-crystal silicon ingots and final formation of single-crystal silicon wafers is well documented in the art and will not be discussed further. A unique feature of the present invention is that the starting single-crystal substrate is converted during the manufacturing process into channel regions by etching through the upper or topmost surface 15 and lower surface 18 of the single crystal silicon wafer body 10.

First Gate Dielectric or Gate Oxide 20

Gate dielectric materials for the present invention are selected from those used in the art. Examples of useful materials include silicon oxide, silicon nitride, aluminum oxide, hafnium oxide, tantalum oxide, titanium oxide or composites thereof. A most preferred gate dielectric material is silicon dioxide grown by standard methods known in the art. Other materials could be sputtered or deposited by chemical vapor deposition techniques, such as Jet Vapor Deposition, which is also known in the art. The thickness of the gate dielectric layer of the present invention is between about 10 and about 40 angstrom.

First Gate Conductor Layer 30

The preferred gate conductor for the present invention is germanium. It should be understood that although germanium can be used in its pure state, this invention also allows for the use of germanium-containing compositions. Such germanium-containing compositions include mixtures of germanium and silicon wherein the concentration of silicon can be as high as 50% by weight. The gate conductor can initially be deposited as a uniform layer and then selectively etched in a subtractive process or it can be deposited selectively onto exposed areas of the first gate dielectric in an additive process. Typically, germanium and its mixtures are applied by chemical vapor deposition or sputtering, as known in the art. A useful thickness of the germanium layer is between 0.01 and 1 micron. A preferred thickness for the germanium first layer is between 0.05 and 0.03, while a most preferred thickness for the first germanium layer is 0.05 and 0.3 microns.

First Dielectric Insulating Region 50

The present invention utilizes known insulating or fill materials as used in the art. These include the same materials as in the gate dielectric, namely silicon oxide, silicon nitride, aluminum oxide, hafnium oxide, tantalum oxide, titanium oxide, or composites thereof. These materials can be chosen independently of the gate dielectric 20 material. A preferred dielectric insulation material is silicon dioxide. A preferred process in the present invention utilizes a TEOS process (tetrakis ethoxy silane) for a thermal CVD process to deposit the oxide.

Conformal Coating 110

A coating of silicon nitride or silicon carbide is deposited on the exterior surfaces of the first intermediate germanium gate stack 38 and the exposed surfaces of the silicon wafer. The conformal layer 110 serves as an etch stop in the later processing steps of the inventive process and lateral portions may be optionally removed in a polishing step from the final germanium-containing dual gate article.

Channel Layer 11

The present invention utilizes a silicon channel layer separating the two conductor gates. The silicon channel layer may be formed from either a single-crystal silicon wafer bonded indirectly to gate conductor 30 or by the common practice of epitaxially growing silicon (otherwise known as epi-silicon) onto the top surface of a gate oxide region 20 of gate conductor layer 30. Preferably, the silicon channel layer 10 in the present invention is provided by bonding a single-crystal silicon wafer to the conductor gate oxide regions 20. In the present invention, the single-crystal wafer employed as the channel to separate the gates in the present invention can be the one used as the initial substrate 10. This is accomplished by reversing the orientation of the in-process device (i.e., rotating the device such that the bottom single-crystal silicon substrate 10 now is the topmost layer). After being placed in this configuration it may be thinned to less than 0.1 micron and preferably thinned to between 0.03 and 0.1 micron. At this thickness there is optimum gate control to regulate the device, and also optimum device drive current. The process for applying, thinning/grinding and polishing this second wafer is discussed below in the processing section. One significant benefit for using a bonded single-crystal wafer compared to epi-silicon grown laterally over the insulator is the reduction in defects associated with epitaxially growing this channel layer 11.

Second Gate Dielectric or Gate Oxide 20a

The present invention utilizes the same materials from those discussed for the first gate dielectric 20 materials, but are independently selected. Likewise, the processes for application of the second gate dielectric layer are similar, but independently selected to those processes described for the first gate dielectric layer.

Second gate Conductor 30a

The present invention utilizes the same materials and processes, but are independently selected from those discussed for the first gate conductor 30 materials and processes. A useful thickness of the germanium layer is between 0.01 and 1 micron. A preferred thickness for the germanium first layer is between 0.05 and 0.03 micron, while a most preferred thickness for the first germanium layer is 0.05 and 0.3 microns. The thicknesses of the first and second germanium layers are independently selected.

Second Dielectric Insulating Region 50a

The present invention utilizes the same materials, but are independently selected from those discussed for the first dielectric insulating 50 materials.

Photoresist Layer 40 and 40a

Photoresists and the photolithographic process of using them are well known in the art of manufacturing semiconductor chips. Typically, the photoresist material is either positive or negative working and can be either in dry film or liquid form as applied to the intermediate manufacture article. As will be described in further detail the use of photoresist materials allows for the conversion of a portion or region of an underlying surface or layer to be modified in some fashion without modifying other portions or regions. This is accomplished by selectively removing regions of the photoresist thereby uncovering portions of the layers beneath it. These uncovered regions can then be modified by chemical or mechanical processes. Typically, chemical modification can be made either to the surface of the exposed layer or to the entire uncovered layer. For example, the uncovered surface can be modified by ion implantation or can be used as a growth site for additional layers such as using processes such as sputtering or chemical vapor deposition. Alternatively, the exposed region can be removed by etching to reduce thickness or even to completely remove the layer in the uncovered region thereby uncovering layers beneath it.

The process of selectively removing portions of the photoresist are well known in the art and typically are known as photolithographic means. This process usually entails, exposing certain, predetermined areas of the photoresist using a mask to particle or electromagnetic radiation. The irradiation process induces a chemical change in the exposed photoresist portions such that a change in physical properties is obtained relative to the unexposed areas. The property of greatest significance is solubility in etching formulations. After irradiation the photoresist layer is subjected to an etchant that will discriminate between the exposed vs unexposed areas. In the case of positive-working photoresists, areas that have been exposed become more soluble to the etchant formulation and are thereby removed. Negative-working photoresists produce regions that after exposure are less susceptible to etching than those in unexposed areas. In either case, the discriminating etching process is known in the art as "developing". The present invention can use either positive- or negative-working photoresists. Positive-working wet photoresists are preferred in the present invention.

Trim Masks 70

Trim masks can be used in place of photoresist materials of the type discussed above especially for photoresist 40a. In this case the mask is placed in physical contact with the surface of the intermediate and as described for the previous photoresists allows certain, predetermined areas to be treated. Treatment typically involves etching of the uncovered regions to a depth corresponding to the lower surface 103 of the first insulating region 102. The first insulating region acting as an etch stop to prevent significant etching of the single-crystal silicon substrate 60. The mask is then removed without the need for a developing step. Optionally, the trim mask can also assist in the process of selectively ion implanting dopants into the single crystal substrate adjacent to the gate electrode in order to form source and drain sites.

Intermediate and Final Product Designs

The present invention takes advantage of many of the processes and materials known in the art of semiconductor or integrated chip technology. However, the present invention differs from the prior art in that the final article is a dual gate semiconductor device wherein both final gate regions 34 and 34a comprise germanium-containing gate conductors and these gate conductors are separated by a silicon channel region 13. Preferably, the silicon channel layer 10 and region 13 are comprised of a single-crystal silicon wafer. Unique to this design is the requirement that as part of the process of making the final product the two gate conductors 34 and 34a are essentially perfectly aligned one on top of the other. In the art, a process that creates this configuration is referred to as a "self-aligning" process. Many examples of such processes are known in the art since the problem of alignment is pervasive in the industry. However, this invention employs a novel process for "self-alignment", thereby producing novel "self-aligned" germanium-containing dual gate logic semiconductor devices.

It should be noted that prior art references to self-alignment processes do not necessarily relate to the particular process of the present invention. For example, the term "self-alignment" is oftentimes associated with the process of doping by ion implantation. However, in the case of the present invention the term self-alignment is meant to specifically refer to the vertical alignment of the top gate to the bottom gate in double-gate MOSFET stack.

In order to achieve the benefits of the present invention, certain design features are required. Specifically, the preliminary germanium-containing gate structures 32 and 32a must be positioned so that at least a portion of 32a overlaps at least a portion of 32. Furthermore, the photoresist 40a or trim mask 70 must be prepared to create openings that are above both portions of the germanium-containing gate conductors 32 and 32a and also portions of the dielectric insulator regions 52 and 52a. The photoresist 40a or trim mask 70 must also provide protection to two types of predetermined areas where no etching should occur. It is a requirement of this invention that the first type of covered areas 72a be smaller in size than the first and second germanium-containing gate conducting region 32 and 32a and completely reside exclusively over regions 32 and 32a. The second type of covered areas 72b must reside completely over regions of dielectric insulating 52 and 52a.

The side walls 210 of pillar 200 and the sidewalls 260 of dielectric composite regions 250, created from the etching process, are essentially vertical. In this manner the pillars 200 will comprise sidewalls 210 that comprise germanium-containing gate conductor regions while the etched areas, also described as void areas 300, will be bounded on one side by germanium-containing gate conductor pillar 200 while on the other side comprise the dielectric insulating composite region 250.

The present invention further allows for the selective processing of the germanium-containing gate conductors without essentially altering the single-crystal channel that separates them. Specifically, the germanium-containing gate conductors, constituting portions of a self-aligned pillar 200 have a cross-section that initially is equal to the cross-section of the single-crystal silicon channel as is required by the vertical etching process described hereinbelow. After the vertical etching process the exposed sidewalls of the germanium-containing regions 34 and 34a in pillar 200 are preferentially etched compared to the single-crystal silicon channel in order to reduce their cross-section. The process is preferably performed by either isotropic etching or oxidation of the germanium-containing exposed surfaces generating new sidewall surfaces 36 and 36a respectively. Etching of a germanium-containing surface relative to a silicon surface can be accomplished with $CF_2Cl_2$, at 100 mtorr and power levels of about 500 to 1500 Watts. Under these conditions, the germanium etches 5–10 times faster than the silicon (see Materials Research Society Symposium Proceedings Vol 316, 1994, pages 1041 to 1046, Yue Kuo from IBM Research). Germanium can also be etched preferentially to silicon via an indirect process that proceeds by initially preferentially oxidizing germanium in the presence of silicon. This can be achieved either thermally or by a plasma process. Conditions for the plasma process are about 500 C., at about 0.5 to about 0.7 torr oxygen, and about 10–150 volts bias on the wafer. Under these conditions, oxidation times of 30 minutes provides about 800 Angstroms of oxidation. Thermal oxidation of germanium can be achieved at about 550 C. and about 0.5 to about 0.7 torr oxygen. Under these conditions about 630 Angstroms of germanium oxide can be grown after two hours.

The germanium oxide can be washed away by means of a water rinse at room or elevated temperatures. These oxidation and wash conditions are published in Semiconductor Science and Technology, vol 8, September 1993 "Plasma Anodic Oxidation and Nitridation of Germanium Surface", Sun Zhaoqi, Liu Chunrong, p1779–1782.

In the present invention, a typical etch recess distance for an exposed germanium-containing surface is about 0.01 to 1.0 micron. Most preferred etch depth is 0.03 micron.

The etched sidewall surfaces 36 and 36a of the first and second germanium-containing regions respectively are then encapsulated and thereby passivated in a dielectric coating material 80. This dielectric coating layer preferably is composed of germanium nitride, germanium oxide, silicon dioxide, silicon nitride, hafnium oxide, aluminum oxide, tantalum oxide, or titanium oxide. Most preferably the dielectric coating material is germanium nitride. In a preferred process the germanium-containing layer is oxidized under low temperature using a nitrogen ion plasma to convert germanium oxide to germanium nitride or germanium oxynitride.

Void areas 300 subsequently have polysilicon or the like filling 90 between the pillars or regions comprising the encapsulated germanium-containing pillars 200 and pillars 250 comprising the first dielectric insulating fill layer, and the second dielectric insulating fill layer (generated during the vertical etch process). When polysilicon is used it is optionally doped by deposition of diborane, arsine, or phosphine. The deposition process can be performed by such processes as batch thermal chemical vapor deposition, plasma chemical vapor deposition, or plasma enhanced chemical vapor deposition, preferably at 300 to about 500 C. Doping can be performed either prior to or after deposition of the polysilicon fill in order to prepare source and drain sites. Doping with diborane, arsene, or phosphine will generate either P or N-type doped sites.

The polysilicon filled intermediate is further processed by reducing the height of the polysilicon fill 90 to less than the height of the pillars 200 and dielectric insulating composite regions 250 with the use of a plasma reactive ion etch (RIE) process. The RIE process preferably used in the present invention utilizes either a chlorine or fluorine based plasma, as is known in the industry.

After the polysilicon fill is recessed, the wiring necessary to electrically connect the source, drain, and gate is provided.

Embodiments of the Processing Steps for the Present Invention

Figure 1F:
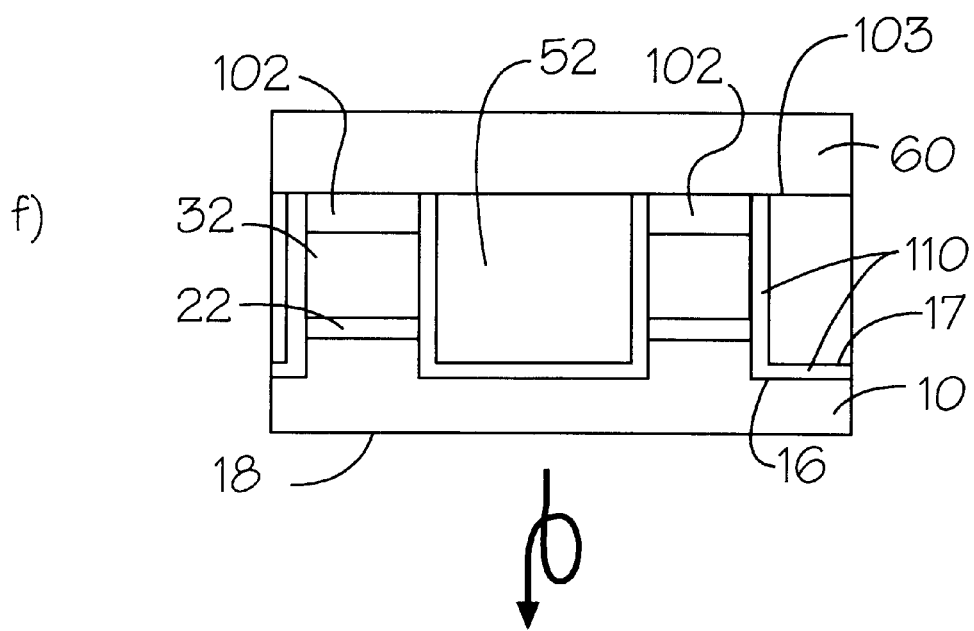
Figure 1F:
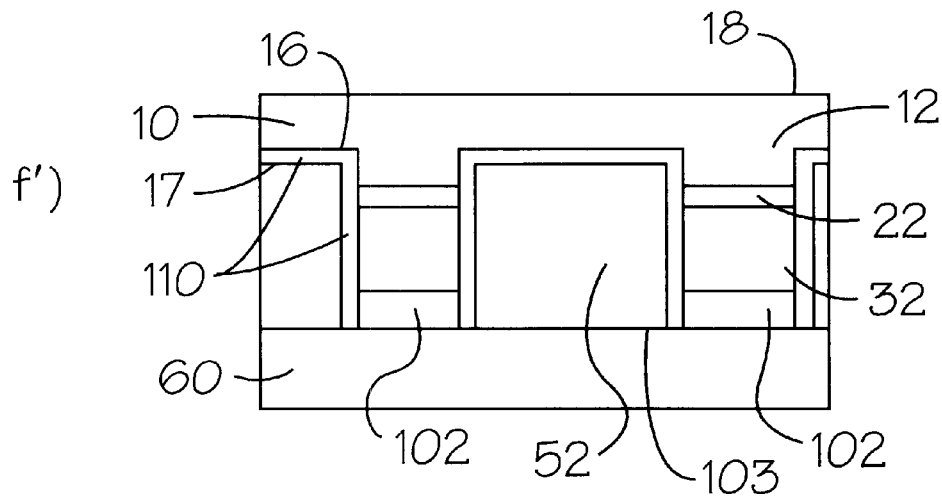
Figure 1F:
Figure 1F:
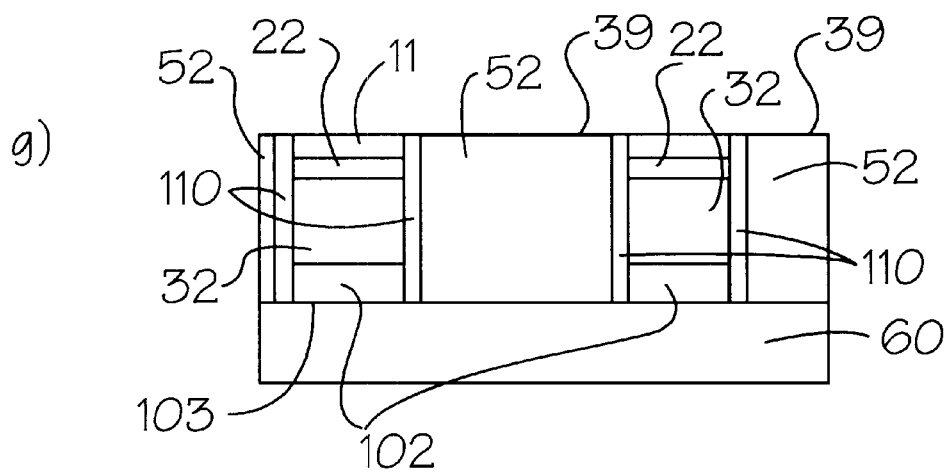
Figure 1F:

One preferred embodiment of a process to manufacture a dual-logic device is depicted in FIG. 1 and includes the following steps:
- to a first outer surface 15 of a first single-crystal silicon wafer 10 is sequentially applied a uniform layer of a gate dielectric 20, a uniform layer of a germanium-containing gate material 30, a uniform layer of silicon dioxide 100 is formed, and a uniform layer of a photoresist material 40 is applied (FIG. 1a);
- the photoresist layer 40 is then imaged and developed to generate developed regions 44 that expose regions of upper surface 105 of the silicon dioxide layer 100, (FIG. 1b);
- the openings 44 are then treated with etchant to completely remove the underlying regions of silicon dioxide 100, germanium-containing gate conductor 30, gate dielectric 20, and partially etch the single-crystal silicon wafer 10, to generate a new surface 16, all lying beneath the openings 44, (FIG. 1c);
- removal of the photoresist then uncovers the upper surface 103 of the remaining silicon dioxide layer 102 covering the germanium-containing gate conductor regions 32, and the remaining gate dielectric regions 22 thus forming gate stack 38;
- a uniform, conformal layer of a dielectric coating material, silicon nitride or silicon carbide 110, is applied to the uncovered regions of the single-crystal silicon wafer 16, the topmost surface 103 and vertical sidewalls 35 of the pillar 38 comprising silicon dioxide region 102, germanium-containing gate conductor regions 32 and the gate dielectric region 22;
- an oxide fill 50 is coated over the silicon nitride 110 coated surfaces of the single-crystal silicon wafer 10 and the silicon dioxide 102 covered germanium-containing gate conductor regions or stratum 32 (FIG. 1d);
- planarization is performed to uncover the topmost surface 103 of silicon dioxide coating on the germanium-containing gate conductor (the silicon nitride coating 110 has also been etched from the uppermost surface 103 of the silicon dioxide) and to create a uniform height for the germanium-containing gate conductor region 38 and the oxide fill region 52, (FIG. 1e);
- a second silicon wafer 60 having a layer of thermally grown silicon oxide of about 500 Angstroms (not shown), said thermally grown dioxide layer being bonded to the planarized surface 103, (FIG. 1f);

For the Purposes of Clarity the Configuration as Described in the Next Steps are Obtained by Rotating the Configuration of the In-Process Device in Steps 1–8 by 180° (E.G., The Topside Has Become the Bottomside). This Rotation Is Not Necessarily Performed in the Actual Manufacturing Process but is Utilized In the Specification to Continue the Process of Manufacture to the Topmost Side) (FIG. 1F').

Figures 1H, 1I, 1J:
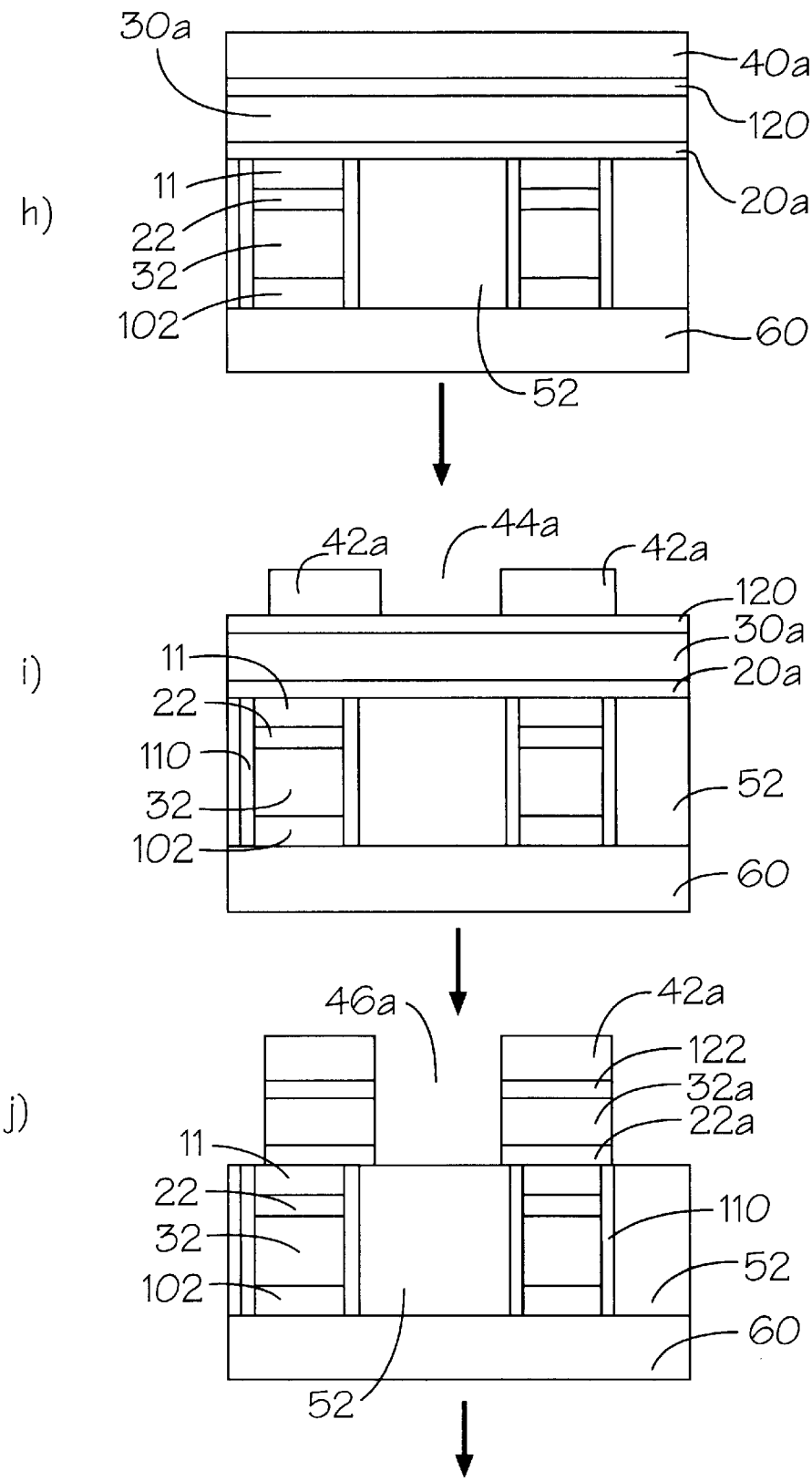
Figures 1K, 1L, 1M:
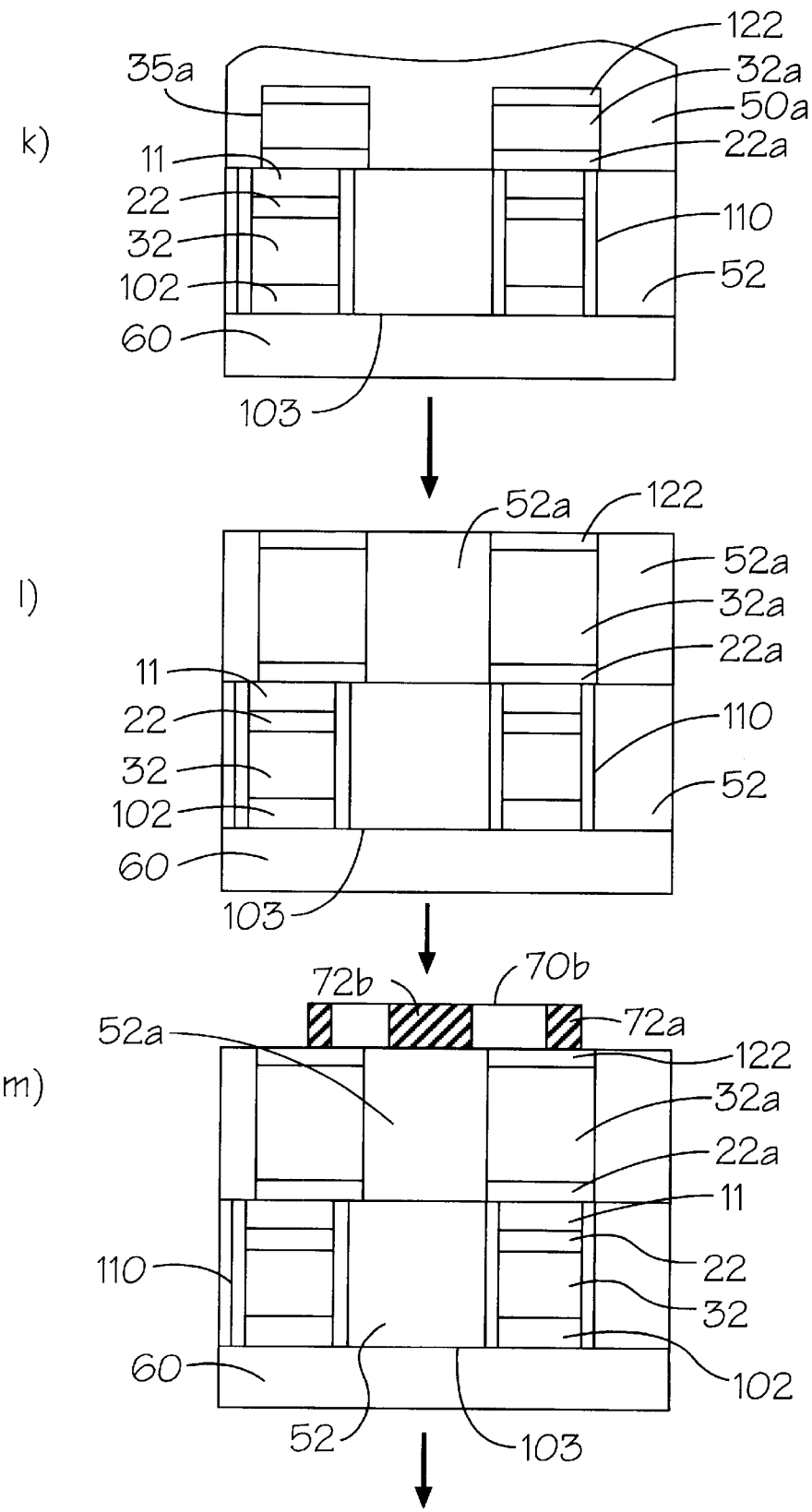
Figure 1N:
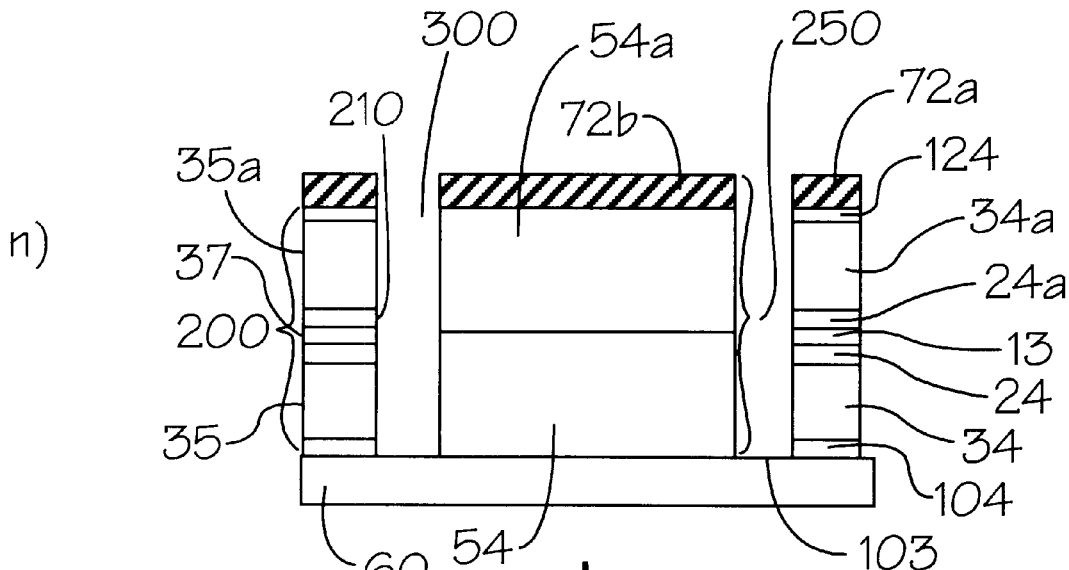
Figure 1O:
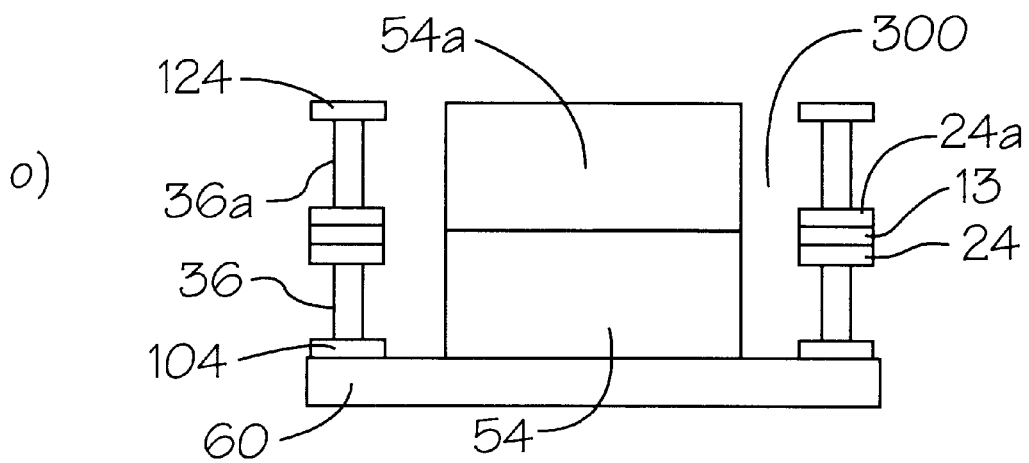
Figures 1P, 1Q:
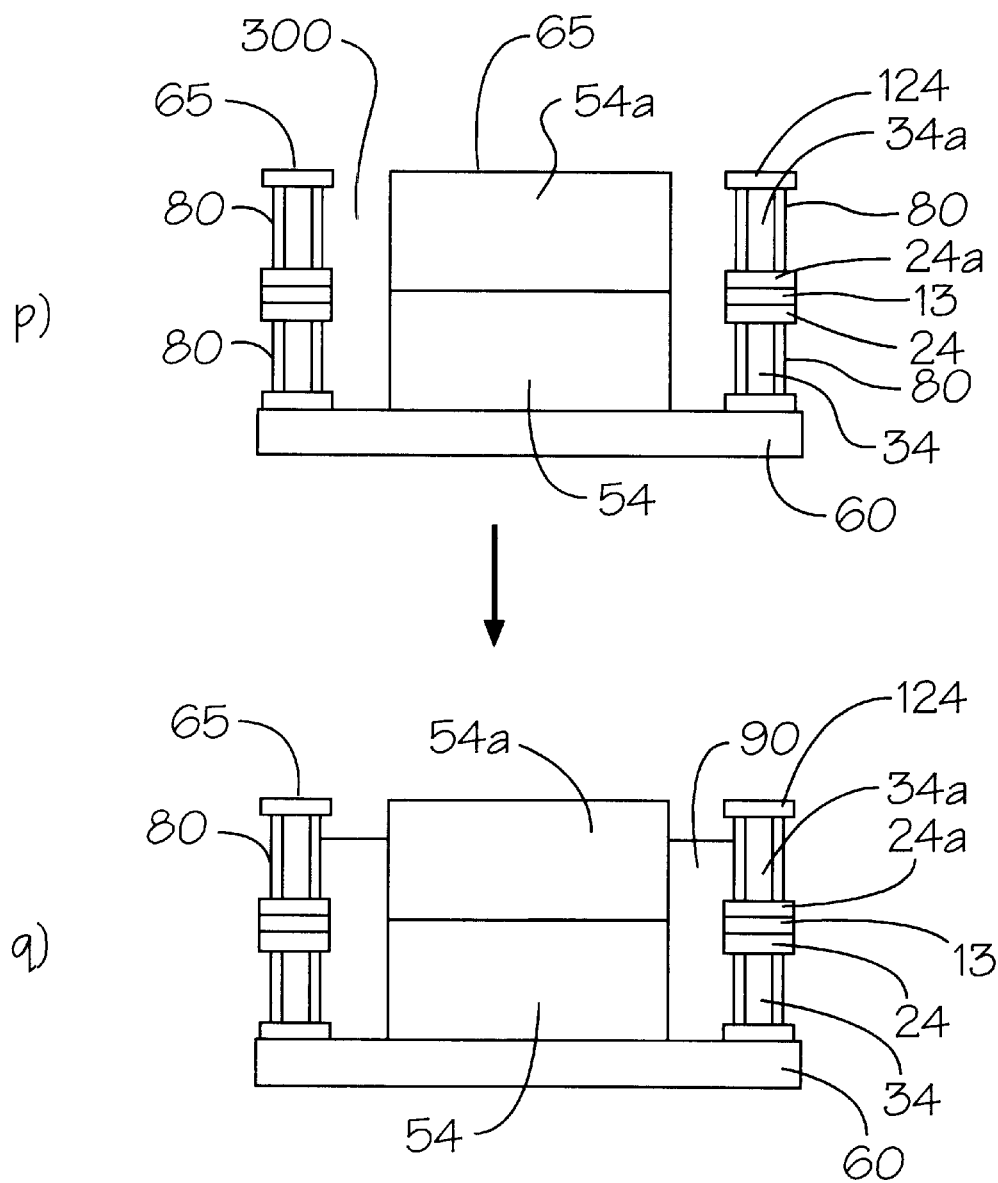

- the first single-crystal silicon wafer 10 is ground to the depth of the now lower surface 17 (39) of the silicon nitride and polished in order to reduce the thickness of the single crystal silicon wafer 10 and thereby remove the silicon nitride 110 originally
- horizontally residing on the first single-crystal silicon wafer 10 and to further create at least one silicon channel 11 residing on the dielectric gate region 22 which separates the channel from the germanium-containing gate conductor region 32, said channel having a thickness of about 300 to about 1000 Angstroms (FIG. 1g);
- sequentially coating uniform layers of a second gate dielectric material 20a, a second germanium-containing gate conductor 30a, silicon nitride 120, and photoresist 40a over both the channel 11 and the dielectric oxide fill (or dielectric insulation fill) 52 regions, (FIG. 1h);
- the photoresist 40a is imaged and developed to create covered regions 42a and openings 44a, the covered regions must at least overlap a portion of the first germanium-containing gate conductor regions 32 and a portion of the adjacent dielectric fill region 52; in the areas where the photoresist openings 44a are located, portions of the second dielectric insulating layer 120, the second germanium-containing gate conductor layer 30a, and the second gate dielectric layer 20a are all etched to uncover portions of the first dielectric fill 52 or first germanium-containing regions 32 to create unetched regions or stacks comprising dielectric insulating regions 122, germanium-containing regions 32a, and gate dielectric regions 22a and also creating void regions 46a (FIGS. 1i and 1j);

the remaining photoresist areas 42a are removed and an oxide fill 50a is coated over the topmost and outer surfaces of 122, outer surfaces 35a of the second germanium-containing gate conductor regions 32a and outer surfaces of the gate dielectric region 22a and into the etched areas 46a formed during the preceding step, (FIG. 1k);

planarization is performed by standard chemical mechanical processing to uncover the silicon nitride coating 122 on the germanium-containing gate conductor 32a and to create a uniform height for the silicon nitride coated germanium-containing gate conductor region 32a and the oxide fill region 52a, (FIG. 11);

a trim mask or photoresist 70 is printed and applied to the planarized surface to create openings that are above and encompass both the germanium-containing gate conductors 32 and 32a and also the dielectric insulator layers 52 and 52a. The photoresist or trim mask 70 must also provide coverage to two types of predetermined areas where no vertical etching occurs. It is a requirement of this invention that the first type of covered areas 72a be smaller in size than the first and second germanium-containing gate conducting region 32 and 32a and exclusively reside over regions 32 and 32a (i.e., no regions of 52 or 52a reside under 72a.) The footprint area of 72a must therefore be no larger than the smaller of the footprint areas of region 32 or 32a. The second type of covered areas 72b must reside completely over regions of dielectric insulating laminate comprising 52 and 52a, (i.e., no regions of 32 or 32a reside under 72b (FIG. 1m), vertical etching (i.e., trimming) is performed to create openings 300 and form gate-stack pillars 200 that are composed of germanium-containing gate conductors and which have sidewalls 210, these pillars are separated from regions of dielectric fill 250 by a distance along the silicon wafer 60; the pillars are disposed on the second silicon substrate 60, and composed sequentially from that substrate starting with a silicon oxide region 104, a first germanium-containing gate conductor 34, a first gate dielectric region 24, a silicon channel 13, a second gate dielectric region 24a, a second germanium-containing gate conductor region 34a, and a silicon nitride top coat 124, in order to align the prior lower gate stack, 32 and 22, with the upper gate stack, 32a and 22a (FIG. 1n);

the germanium-containing gate conductors sidewalls 35 and 35a are recessed using either wet or dry isotropic etch, to a depth of about 200 Angstrom, to form 36 and 36a respectively, leaving the remaining sidewalls 210 comprising silicon nitride topcoat 124, the silicon channel 13, the first and second gate dielectric regions 24 and 24a, and the silicon dioxide regions 104 unaffected, (FIG. 1o);

the sidewalls 36 and 36a of the recessed germanium-containing gate conductor stacks 200 are initially oxidized and then converted to a germanium nitride encasing layer 80, (FIG. 1p);

the void regions 300 separating the recessed germanium-containing gate conductor stacks or pillars 200 from the oxide fill regions 54 and 54a are filled with polysilicon 90 N+doped at about 10E19 to about 10E21 atoms/cm2 or As or P doped at optimally 10E20, to provide source/drain contacts to the channel (the dopant in the polysilicon diffuses into the single-crystal silicon channel thereby forming the source/drain extensions for the double gate device);

the height of the polysilicon fill areas is reduced below the height 65 of recessed germanium-containing gate conductor stacks 200 and the oxide fill regions 54 and 54a and then the polysilicon regions (source and drain) are electrically connected to the single crystal silicon channel regions (FIG. 1q). In this process the dopant from the polysilicon is diffused into the single crystal silicon to form source/drain extensions for the double gate FET device.

Figure 2A:
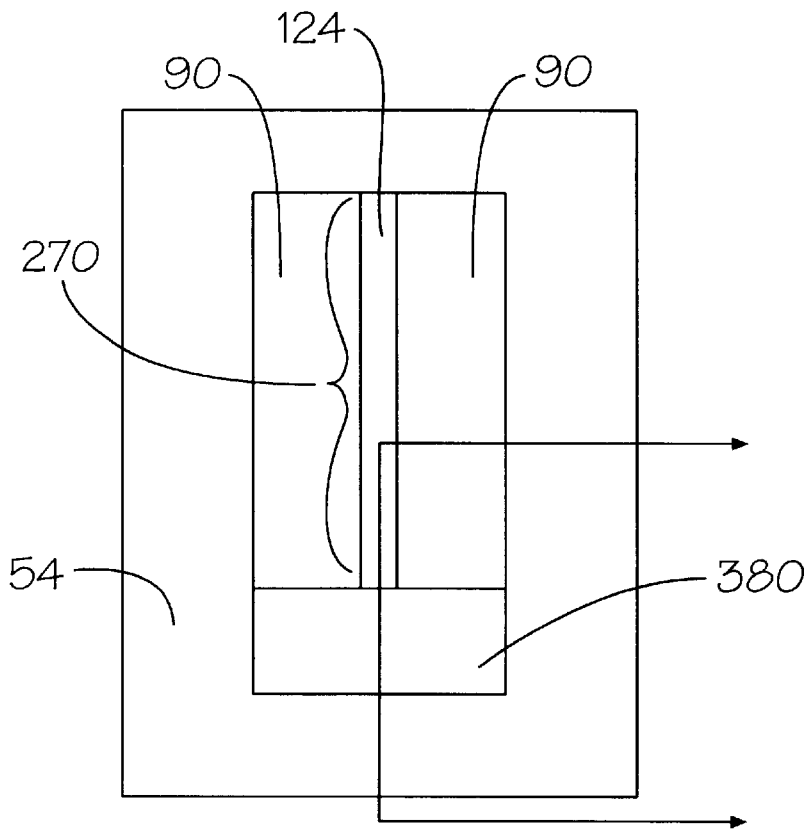
FIG. 2 is an enlarged plat view and an cross-sectional segment thereof containing representations of a single gate element 200 flanked by polysilicon fill 90, as it is processed through the steps of a second embodiment of the present invention. The gate element 200 further comprising land features 380 to assist in connecting the dual gate logic device to an external electrical power supply.
Figure 2A:
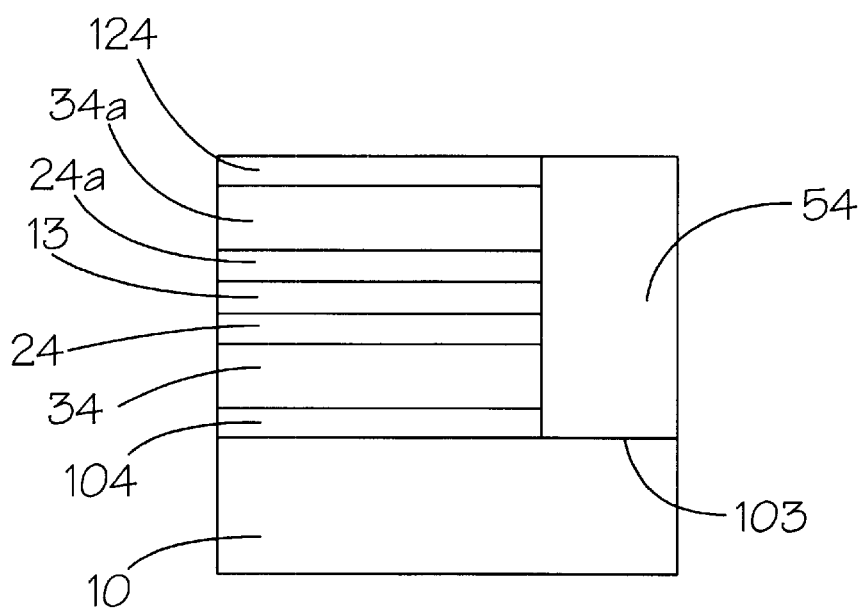

The embodiments described hereinabove require electrical connection to an external power supply in order to function properly. An example of a useful method for forming electrical connections between the dual germanium gate regions and the source/drain regions includes the construction of a landing pad 300. As can be seen in FIG. 2a, dual gate element 270 is flanked on both sides by polysilicon regions 90. During the time of manufacture of these elements a landing pad 380 is constructed of the same components as the dual gate element 270 and is itself an integral element located at the end of the dual gate element 270 and having a width that includes the dual gate element 270 and the two flanking polysilicon fill regions 90. A typical construct is shown in FIG. 2a comprising a top-down view and a cross-sectional representation. The orientation of the top-down and cross-sectional representation views are orthogonal to the views presented in FIG. 1.

Figure 2B:
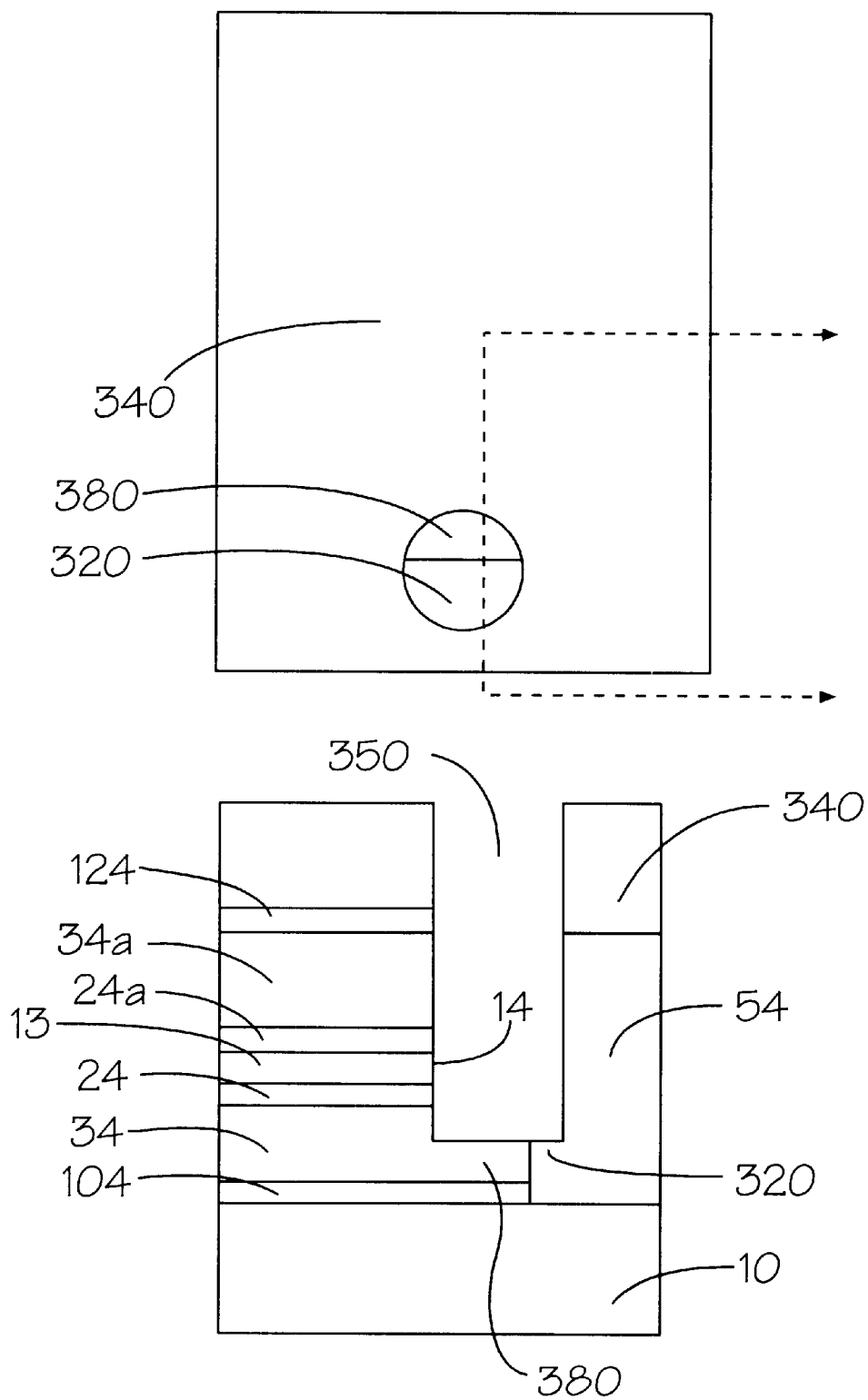

Referring to FIGS. 2a and 2b, the process of making the electrical connections begins with coating a photoresist 340 over the top surface of an intermediary dual gate device 270 and imaging and developing the photoresist creating an opening 350 essentially having a predetermined cross-section. The opening 350 is over a portion of the dual gate pillar 200 referred to as the landing pad 380 and another portion of the opening is over a section 320 of the silicon dioxide fill region 54. Etching by RIE through the opening 350 is performed to the topmost germanium gate 36a, the topmost gate dielectric region 24a, the silicon channel 13, the lower gate dielectric region 24 and partially into the lower germanium gate 34. In this manner the sides of the upper germanium gate 34a, the silicon channel 13, and the landing pad 380 are exposed (FIG. 2b).

Figure 2C:
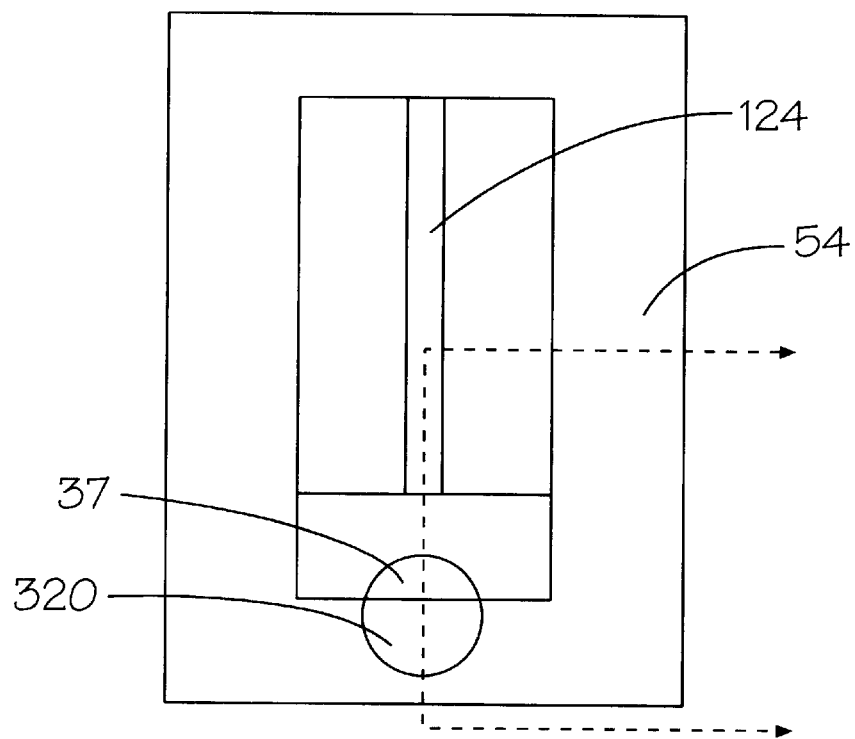
Figure 2C:
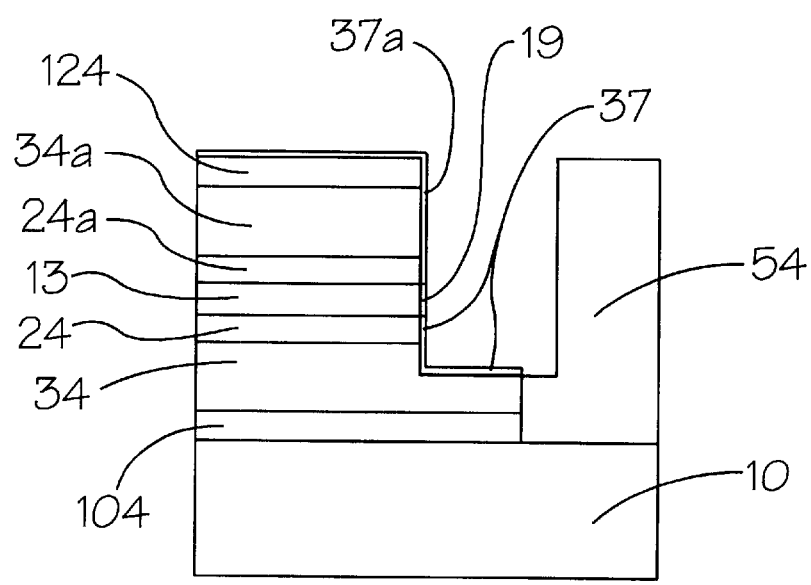

The undeveloped photoresist is stripped from the top surface and all exposed surfaces are subjected to oxidizing conditions that typically include an oxygen plasma at elevated temperatures. Useful temperatures range from 500 to 700 C., optimally 600 C. Under these conditions the exposed surfaces of the silicon channel 13 and both germanium gates 34 and 34a are converted into their respective oxides. The depth of the thus formed germanium oxide coatings 37 and 37a are typically about 50 Angstrom while the depth of the thus formed silicon dioxide coating 19 is typically about 20 Angstroms. (FIG. 2c).

Figure 2D:
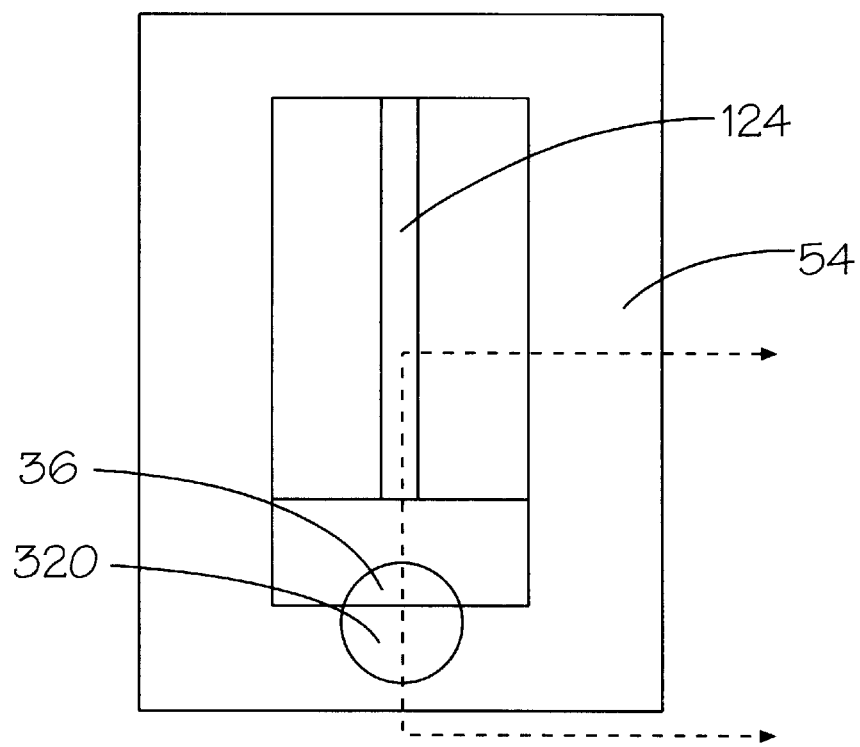
Figure 2D:
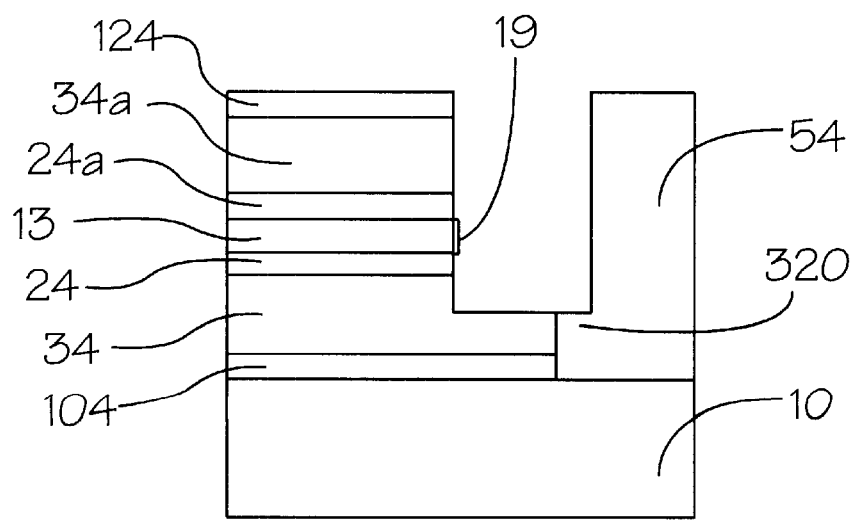

Removal of the germanium oxide coatings 37 and 37a, without simultaneous removal of the silicon oxide coating 19 is achieved with a water rinse at ambient or elevated temperature. In this manner the silicon channel 13 is protected with an insulating layer 19 thereby electrically isolating it from the subsequent steps described below; (FIG. 2d).

Figure 2E:
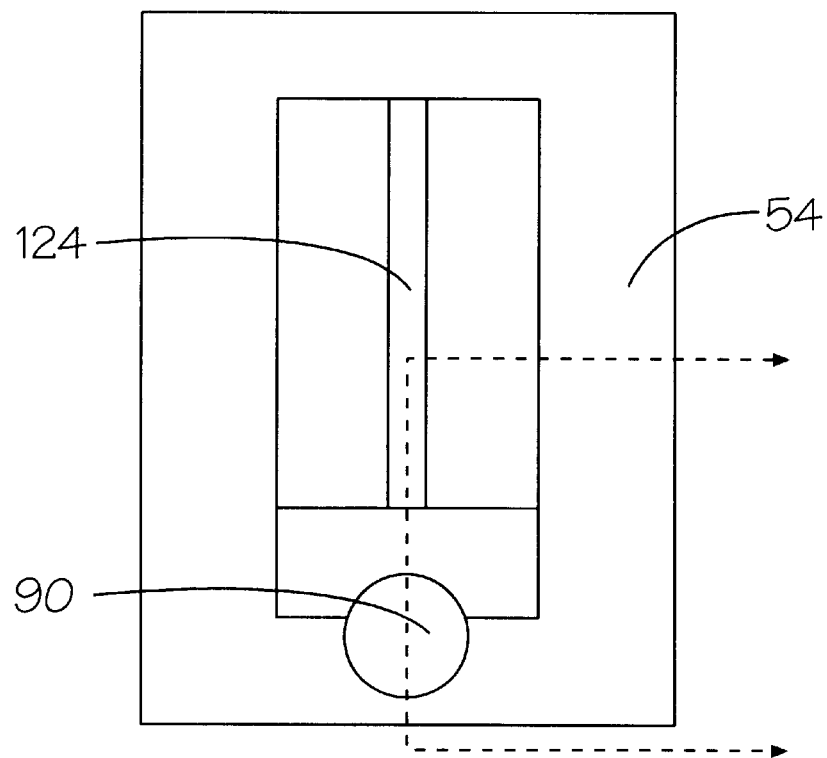
Figure 2E:
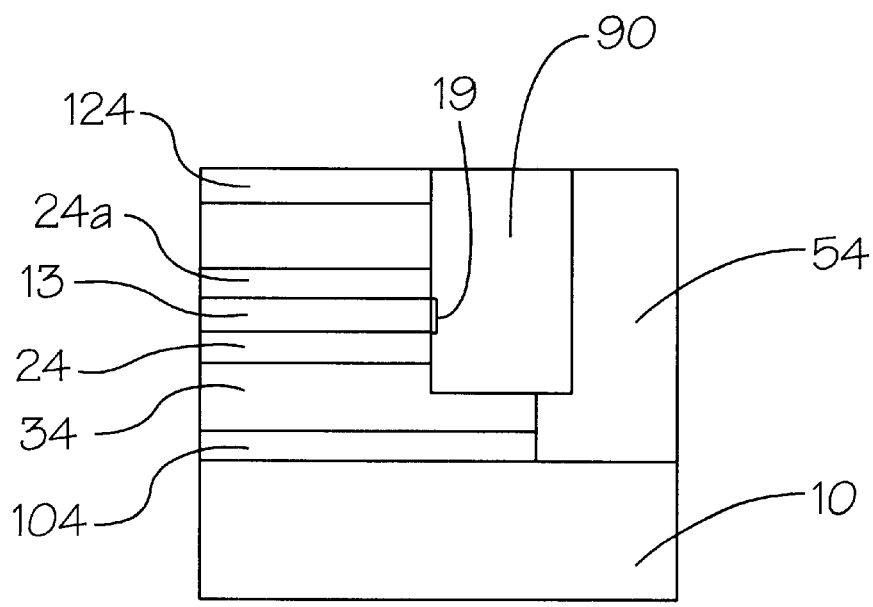
Figure 2F:
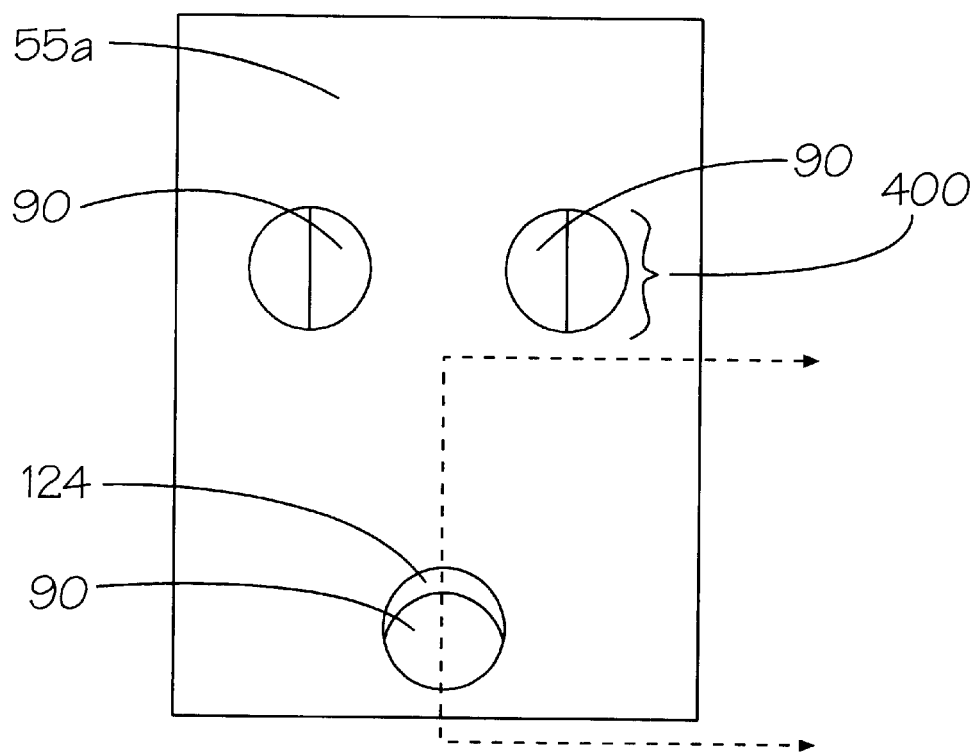
Figure 2F:
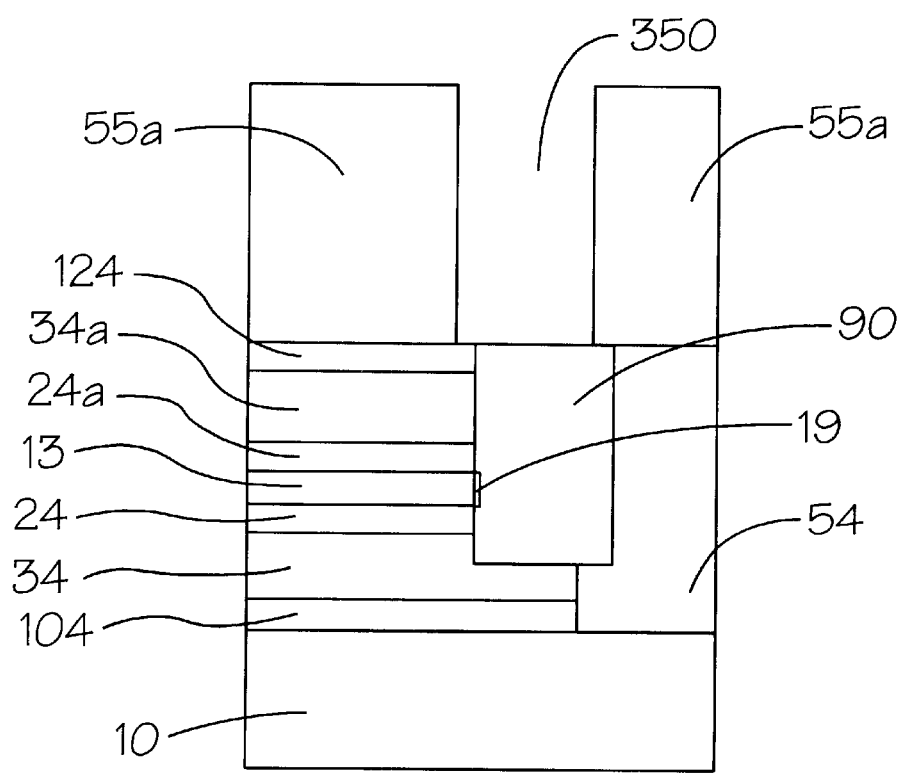

By conventional chemical vapor deposition (CVD), doped polysilicon 90 is then added to the contact hole or void 300 and the upper surface is planarized by chemical mechanical polishing (CMP) (FIG. 2*e*).

The contact and wiring scheme is then completed by depositing dielectric, such as silicon dioxide, over the planarized wafer surface, and then patterning the silicon dioxide layer with a photoresist (not shown) and etching the resist pattern into the dielectric layer 55*a*. The etched pattern 55*a* is designed to create a minimum of three via openings; the first via is positioned approximately over the filled contact hole 350, and the second and third via are positioned partially over each side of the polysilicon fill 90 which flanks the dual germanium gate pillar 200 and partially over the surrounding silicon dioxide insulator 54. The at least three via are filled with a conductive material such as tungsten or copper, using conventional techniques to complete the electrical connection between source/drain sites 400 and the landing pad 380. Typically, conductive wiring is attached to the topmost surface of each via to electrically connect the dual gate device to an external power source.

Although two preferred embodiments are described in detail it can readily be understood that there exists obvious permutations that would still fall within the spirit of the invention. By way of example, it is possible to apply the various materials such as the insulator layer 102, the gate conductor region 32, and the gate dielectric region 22 (each one atop the other) on discrete areas of the substrate, while depositing an insulating region on the remaining discrete surfaces of the substrate. In this manner gate stacks can be formed directly. Alternatively, all gate stack materials can initially be applied as uniform coating on the substrate. In this case etching in specific areas would then be required to form the final gate stacks, followed by deposition of a insulator fill into the etched areas. In another embodiment, the silicon dioxide fill is initially applied, and after etching to create openings, the gate stack is formed in the etched areas. After application of the silicon channel, the same embodiments as described to form the first gate stack can be independently selected to form the second gate stack. A proviso to these alternative processes is that there must be an overlap of regions of the first and second gate stacks.

In another embodiment, it is desired to use a silicon wafer as the channel that is other than the original silicon substrate. In this process the original substrate remains in its initial configuration (i.e., the dual gate element resides on the upper surface of the original silicon substrate). A second silicon wafer is then used as the channel layer. It is preferred that this second wafer be composed of single-crystal silicon.

It is also specifically contemplated that the order of the manufacturing steps may be varied and still generate a final product that performs essentially the same function as the present invention. All these types of permutations are considered within the scope of the invention.

Other embodiments and modifications of the present invention may occur to those of ordinary skill in the art subsequent to a review of the present application and the information presented herein; these embodiments and modifications, as well as their equivalents, are also included within the scope of this invention.

We claim:

1. A method of forming an intermediary structure for use in a dual gate device comprising the steps:

providing a single-crystal silicon substrate comprising upper and lower surfaces and an internal body, said upper surface comprising raised islands, a plurality of pillars comprising sequentially from said raised islands, a uniform gate dielectric stratum, a germanium gate conducting stratum, and an insulating stratum, said pillars comprising exterior sidewalls and a top surface;

conformally applying a dielectric coating on said exterior sidewalls and said top surface of said pillars and said remaining upper surfaces of said single-crystal silicon substrate;

covering said conformal dielectric coating with a dielectric fill to a height at least of said dielectric coating on said top surface of said pillar;

removing said dielectric coating from said top surface to create a new top surface of said pillar and planarizing said dielectric fill to said new pillar top surface;

applying a silicon wafer to said planarized dielectric fill surface and said new pillar top surface; and etching said lower single-crystal silicon surface to a depth of said conformal dielectric coating on said single-crystal silicon upper surface, said conformal coating acting as an etch stop thereby creating isolated single-crystal channels.

2. A method of forming an intermediary structure for use in a dual gate device comprising the steps:

providing a silicon substrate comprising an upper surface, a first layer residing on said upper surface comprising first pillars and first regions and said first layer further comprising a top surface, said first pillars comprising sequentially from said upper surface, a first insulating stratum, a first gate conducting stratum, a first dielectric gate stratum, and a silicon channel, said first pillars further comprising sidewalls coated with a conformal dielectric coating, said first regions comprising a dielectric fill, said first coated pillar and said first region are adjoined by a first interface, a second layer residing on said first layer top surface comprising second pillars and second regions and a top surface, said second pillars comprising sequentially from said first layer top surface a second dielectric gate stratum, a second gate conductor stratum, and a second insulating stratum, said second regions comprising a second dielectric fill, said second pillars and said second dielectric fill regions being adjoined by a second interface, wherein said first and second pillars at least partially overlap and said first and second regions partially overlap, selectively etching areas comprising said first and second interfaces thereby creating first and second self-aligned columns, said first self aligned column comprising sequentially from said upper surface, a third insulating stratum, a third gate conductor stratum, a third gate dielectric stratum, a second silicon channel, a fourth gate dielectric stratum, a fourth gate conductor stratum, and a fourth gate insulating stratum, said second self-aligned column comprising a third dielectric fill stratum and a fourth dielectric fill stratum, said first and said second self-aligned columns being separated by a void along said upper surface.

3. The method of forming an intermediary structure for use in a dual gate device as recited in claim 2, wherein said first and second gate conducting strata independently comprise germanium-containing material.

4. The method of forming an intermediary structure for use in a dual gate device as recited in claim 2, wherein said channel comprises single-crystal silicon.

5. The method of forming an intermediary structure for use in a dual gate device as recited in claim 3, wherein said first and second gate conducting strata independently comprise germanium-containing material.

6. A method of forming an intermediary structure for use in a dual gate device comprising the steps of:

providing a silicon substrate comprising an upper surface, residing on said upper surface a first pillar and separated by a void, a second pillar, said first pillar comprising layers sequentially affixed from said upper surface comprising a first insulating layer, a first germanium-gate conductor layer, a first gate dielectric layer, a silicon channel, a second dielectric gate layer, a second germanium-gate conductor layer, and a second insulator layer, said first pillar comprising a top surface, said second pillar comprising a first dielectric fill layer and a second dielectric fill layer, said second pillar comprising a top surface, all said layers further comprising an exterior surface; and selectively recessing said first and said second germanium-gate conductor exterior surfaces without significantly recessing said channel or said first or second gate dielectric exterior surfaces or said first or second insulating layer exterior surfaces in order to create a first germanium-gate recessed surface and a second germanium-gate recessed surface.

7. The method of forming an intermediary structure for use in a dual gate device as recited in claim 6, wherein said silicon channel comprises single-crystal silicon.

8. The method of forming an intermediary structure for use in a dual gate device as recited in claim 6, wherein said recessing step comprises isotropic etching or oxidation of said first and second germanium-gate conductor exterior surfaces.

9. The method of forming an intermediary structure for use in a dual gate device as recited in claim 5, wherein said recessing step comprises isotropic etching of said first and second germanium-gate conductor exterior surfaces.

10. The method of forming an intermediary structure for use in a dual gate device as recited in claim 8, wherein said isotropic etching is accomplished with CF2C12, at 100 mtorr and power levels of about 500 to 1500 watts.

11. The method of forming an intermediary structure for use in a dual gate device as recited in claim 9, wherein said recessing step comprises the step of:

oxidation of said germanium-containing exterior surfaces thereby forming a germanium oxide coating.

12. The method of forming an intermediary structure for use in a dual gate device as recited in claim 11, wherein said oxidation comprises thermal oxidation of said germanium-gate exterior surfaces at about 550 C. and about 0.5 to about 0.7 torr oxygen.

13. The method of forming an intermediary structure for use in a dual gate device as recited in claim 11, wherein said oxidation comprises plasma oxidation at about 500 C., at about 0.5 to about 0.7 torr oxygen, and about 10–150 volts bias on said substrate.

14. The method of forming an intermediary structure for use in a dual gate device as recited in claim 11, further comprising the step of:

a) using a nitrogen ion plasma to convert said germanium oxide to germanium nitride or germanium oxynitride.

15. The method of forming an intermediary structure for use in a dual gate device as recited in claim 14, wherein said voids are filled to a height below said first and second pillar top surfaces with polysilicon material doped with N or P materials.

16. The method of forming an intermediary structure for use in a dual gate device as recited in claim 15, wherein said N or P doped materials comprise diborane, arsine, and phosphine at about 10E19 to 10E21 atoms/cm2.

17. The method of forming an intermediary structure for use in a dual gate device as recited in claim 11, further comprising the step of:

washing away said germanium oxide coating by means of a water rinse at room or elevated temperatures to form a first and second germanium-gate recessed surface; and applying a dielectric coating layer to said first and second germanium-gate recessed surface, said dielectric coating comprising germanium nitride, germanium oxide, silicon dioxide, silicon nitride, hafnium oxide, aluminum oxide, tantalum oxide, or titanium oxide.

18. The method of forming an intermediary structure for use in a dual gate device as recited in claim 17, wherein said polysilicon material is doped with N or P materials.

19. The method of forming an intermediary structure for use in a dual gate device as recited in claim 18, wherein said N or P doped materials comprise diborane, arsine, and phosphine at about 10E19 to 10E21 atoms/cm2.

20. The method of forming an intermediary structure for use in a dual gate device as recited in claim 6, further comprising the step of:

applying a dielectric coating layer to said first and second germanium-gate conductor recessed surfaces, said dielectric coating comprising germanium nitride, germanium oxide, silicon dioxide, silicon nitride, hafnium oxide, aluminum oxide, tantalum oxide, or titanium oxide.

21. The method of forming an intermediary structure for use in a dual gate device as recited in claim 6, further comprising the step of:

applying a dielectric coating layer to said first and second germanium-gate conductor recessed surface, said dielectric coating comprising germanium nitride.

22. The method of forming an intermediary structure for use in a dual gate device as recited in claim 21, wherein said voids are filled to a height below said first and second pillar top surfaces with polysilicon material doped with N or P materials.

23. The method of forming an intermediary structure for use in a dual gate device as recited in claim 22, wherein said N or P doped materials comprise diborane, arsine, and phosphine at about 10E19 to 10E21 atoms/cm2.

* * * * *